United States Patent
Nagata et al.

(10) Patent No.: US 12,327,585 B2
(45) Date of Patent: Jun. 10, 2025

(54) SEMICONDUCTOR DEVICE

(71) Applicant: RENESAS ELECTRONICS CORPORATION, Tokyo (JP)

(72) Inventors: Shunya Nagata, Tokyo (JP); Kouji Satou, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 159 days.

(21) Appl. No.: 17/993,364

(22) Filed: Nov. 23, 2022

(65) Prior Publication Data

US 2023/0186981 A1 Jun. 15, 2023

(30) Foreign Application Priority Data

Dec. 15, 2021 (JP) .................................. 2021-203770

(51) Int. Cl.
*G11C 11/419* (2006.01)
*G11C 11/418* (2006.01)

(52) U.S. Cl.
CPC .......... *G11C 11/419* (2013.01); *G11C 11/418* (2013.01)

(58) Field of Classification Search
CPC .................................................... G11C 11/418
See application file for complete search history.

(56) References Cited

U.S. PATENT DOCUMENTS

| | | | | |
|---|---|---|---|---|
| 6,972,987 | B1* | 12/2005 | Wong | G11C 11/412 365/156 |
| 2001/0046173 | A1 | 11/2001 | Yoshikoshi | |
| 2004/0085800 | A1 | 5/2004 | Ogawa et al. | |
| 2006/0023521 | A1 | 2/2006 | Gabric et al. | |
| 2006/0056229 | A1 | 3/2006 | Maeda et al. | |
| 2006/0239068 | A1* | 10/2006 | Boemler | G11C 8/16 365/185.01 |
| 2014/0254242 | A1* | 9/2014 | Siau | G11C 13/004 365/148 |
| 2014/0293679 | A1 | 10/2014 | Behrends et al. | |
| 2019/0392179 | A1* | 12/2019 | Lu | G11C 8/10 |
| 2022/0199153 | A1 | 6/2022 | Nagata | |

FOREIGN PATENT DOCUMENTS

| | | |
|---|---|---|
| JP | Hei7-078479 A | 3/1995 |
| JP | 2004-158084 A | 6/2004 |
| JP | 2006-85786 A | 3/2006 |
| JP | 2022-98600 A | 7/2022 |

OTHER PUBLICATIONS

Kevin Self, "Application Note 2033, SRAM-Based Microcontroller Optimizes Security," [online], Jun. 27, 2003, [searched on Nov. 25, 2020], Internet <URL: https://pdfserv.maximintegrated.com/en/an/AN2033.pdf>.

Office Action dated Jan. 7, 2025, from corresponding Japan Patent Application No. 2021-203770, 9 pages.

* cited by examiner

*Primary Examiner* — Douglas King
(74) *Attorney, Agent, or Firm* — Rimon P.C.

(57) ABSTRACT

Provided is a technology capable of initializing data in memory cells at a relatively high speed while suppressing an area increase. Based on a fact that the reset signal is turned to a high level, a control circuit of a semiconductor device turns a first transistor to an OFF state, a plurality of word lines to a selection state, a precharge circuit to the OFF state, column switches for writing to an ON state, and column switches for reading to the OFF state, causes write circuits to turn first bit lines and second bit lines to a low level and a high level, respectively, and initializes a plurality of memory cells.

7 Claims, 13 Drawing Sheets

SEMICONDUCTOR DEVICE

CROSS-REFERENCE TO RELATED APPLICATIONS

The disclosure of Japanese Patent Application No. 2021-203770 filed on Dec. 15, 2021 including the specification, drawings and abstract is incorporated herein by reference in its entirety.

BACKGROUND

The present disclosure relates to a semiconductor device, and particularly, relates to a technology effective for application to a semiconductor device including a static random access memory (SRAM).

There are a lot of semiconductor devices of data processing apparatuses and the like, each semiconductor device building therein a static random access memory (SRAM) as a memory device for holding data. In the case of storing important data in this SRAM, measures are required from a viewpoint of tamper resistance. In order that a malicious user cannot read contents of the important data stored in the SRAM, required is a technology for instantaneously erasing collectively or initializing the important data stored in the SRAM.

As such technologies for initializing the data stored in the memory cell, there are Patent Documents 1 to 3 and Non-Patent Document 1.

There are disclosed techniques listed below.
[Patent Document 1] U.S. Patent Application No. 2001/0046173
[Patent Document 2] U.S. Patent Application No. 2006/0023521
[Patent Document 3] U.S. Patent Application No. 2014/0293679
[Non-Patent Document 1] Kevin Self, APPLICATION NOTE 2033, SRAM-Based Microcontroller Optimizes Security, [online], Jun. 27, 2003, [searched on Nov. 25, 2020], Internet <URL: https://pdfserv.maximintegrated.com/en/an/AN2033.pdf>

SUMMARY

Patent Document 1 discloses a configuration of a circuit, in which a domino fashion is adopted for rise timing of word lines by addition of a delay circuit, and memory cells are initialized every word line from a word line on a lower side toward a word line on an upper side. In this configuration, when the number of memory cells connected to one bit line is large, it takes a pretty long time to initialize all memory cell data. Moreover, a delay circuit for shifting pieces of such word line rise timing is required, leading to an area increase of a word line decoder unit (also referred to as a row decoder unit).

Patent Document 2 discloses a configuration in which a dedicated bit line control circuit for initializing bit lines is provided. In this configuration, the bit line control circuit is added to a normal read/write control circuit of an SRAM, and therefore, an area of an SRAM macro increases.

Patent Document 3 discloses a configuration in which lines (319, 321) connected to NFETs (3N8, 3N9) of memory cells are separated for each of left and right memory cell nodes and are subjected to a voltage control to facilitate initialization of memory cell data. In this configuration, it is necessary to separate a wiring layout of the lines 319 and 321 connected to the memory cells into a True node and a Bar node, leading to an area increase of the memory cells.

Non-Patent Document 1 discloses: "a supply of power to an SRAM is blocked when a self-destruct input is turned on, and therefore, a program memory and a data memory are also entirely erased". However, it is rather difficult to erase the data in the SRAM at a low temperature. This is because, since all transistors which constitute the memory cells are turned off, electric charges in data holding nodes of the memory cells are not released.

It is an object of the present disclosure to provide a technology capable of initializing the data in the memory cells at a relatively high speed while suppressing the area increase.

Other objects and novel features will be apparent from the description in the specification and the accompanying drawings.

An outline of a representative in the present disclosure will be briefly described below.

A semiconductor device according to an embodiment includes: a plurality of word lines; plural pairs of first bit lines and second bit lines; a plurality of memory cells connected to the plurality of word lines and the plural pairs of first bit lines and second bit lines so that each of the memory cells is connected to one word line and a pair of the first bit line and the second bit line; a first transistor provided between the plurality of memory cells and a power supply potential; a plurality of word line drivers connected to the plurality of word lines; column switches for writing, the column switches being connected to the plural pairs of first bit lines and second bit lines; column switches for reading, the column switches being connected to the plural pairs of first bit lines and second bit lines; a precharge circuit connected to the plural pairs of first bit lines and second bit lines; write circuits connected to the column switches for writing; and a control circuit that receives a reset signal. Based on a fact that the reset signal is turned to a high level, the control circuit turns the first transistor to an OFF state, the plurality of word lines to a selection state, the precharge circuit to the OFF state, the column switches for writing to an ON state, and the column switches for reading to the OFF state, causes the write circuits to turn the first bit lines and the second bit lines to a low level and a high level, respectively, and initializes the plurality of memory cells.

In accordance with the semiconductor device according to the above-described embodiment, the data of the memory cells can be initialized at a relatively high speed while suppressing the area increase.

DETAILED DESCRIPTION

Figure 1:
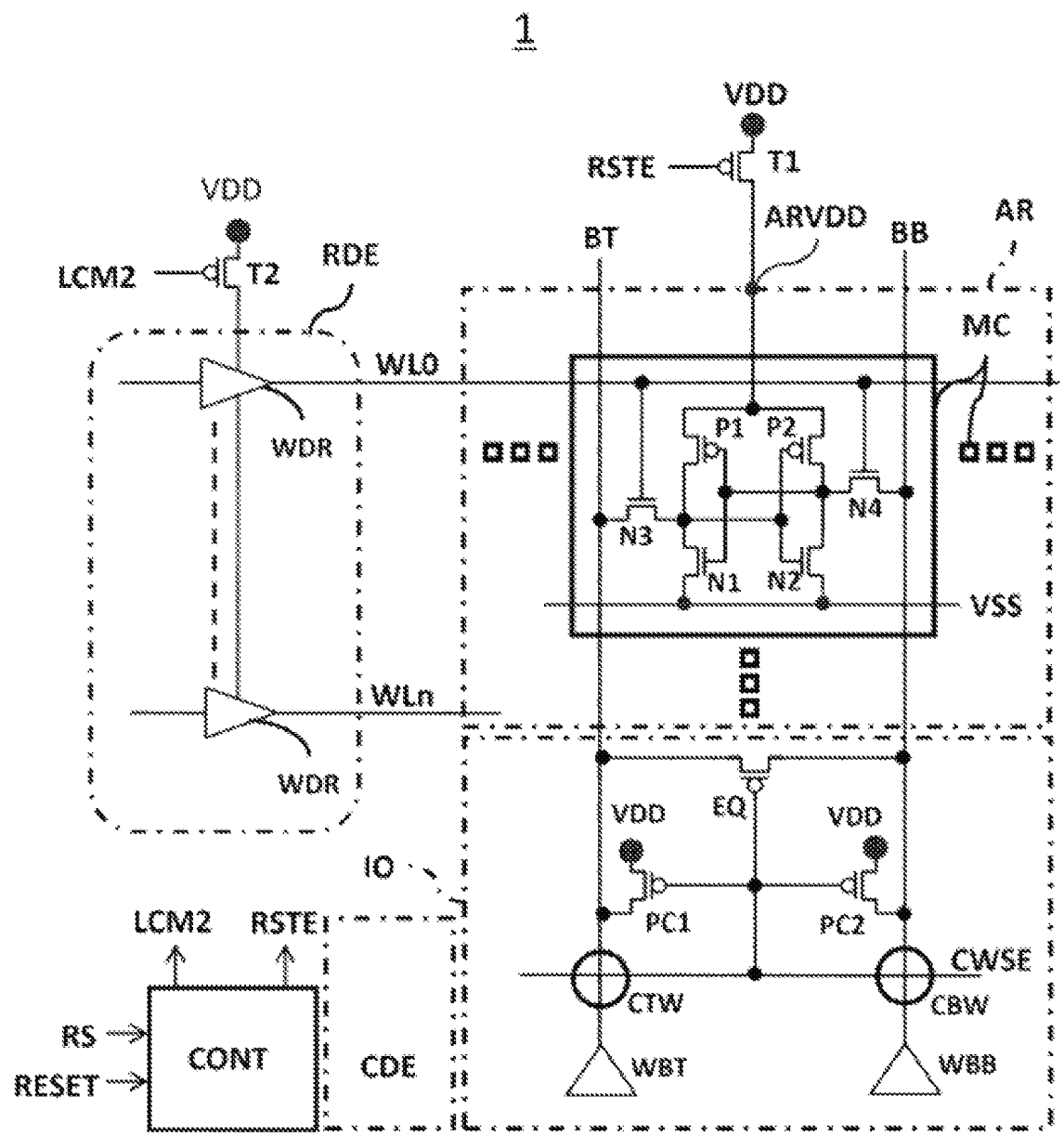
FIG. 1 is a diagram explaining an entire configuration of a memory device according to a first embodiment.

Hereinafter, embodiments will be described with reference to the drawings. Note that, in the following description, the same components are denoted by the same reference numerals, and a repeated description thereof is sometimes omitted. In addition, the drawings are sometimes illustrated schematically in comparison with actual modes in order to further clarify the description; however, the drawings are merely examples, and do not limit the interpretation of the present invention.

First Embodiment

Figure 2:
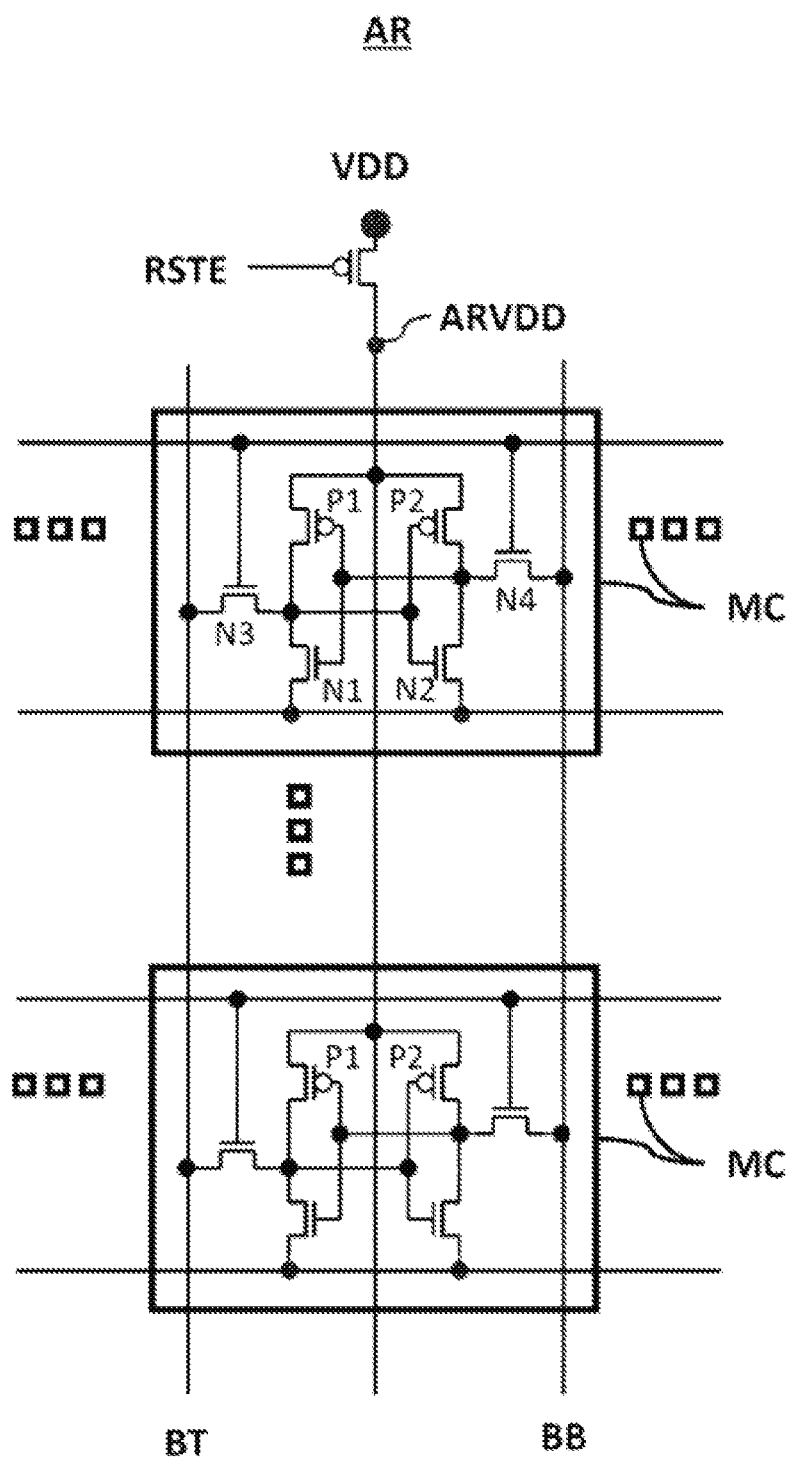
FIG. 2 is a diagram explaining a memory cell unit of the memory device in FIG. 1.
Figure 3:
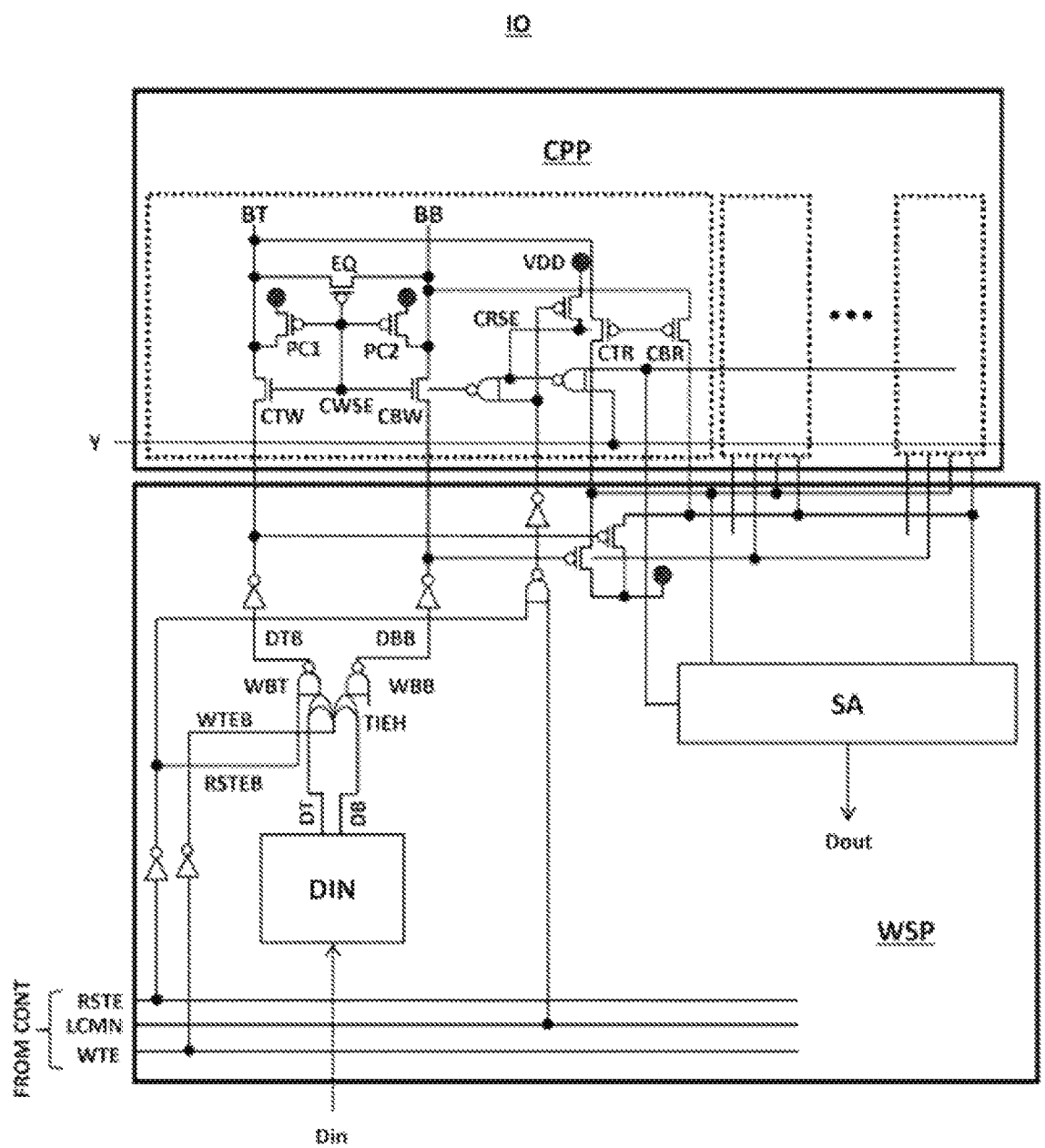
FIG. 3 is a diagram explaining an input/output unit of the memory device in FIG. 1.
Figure 4:
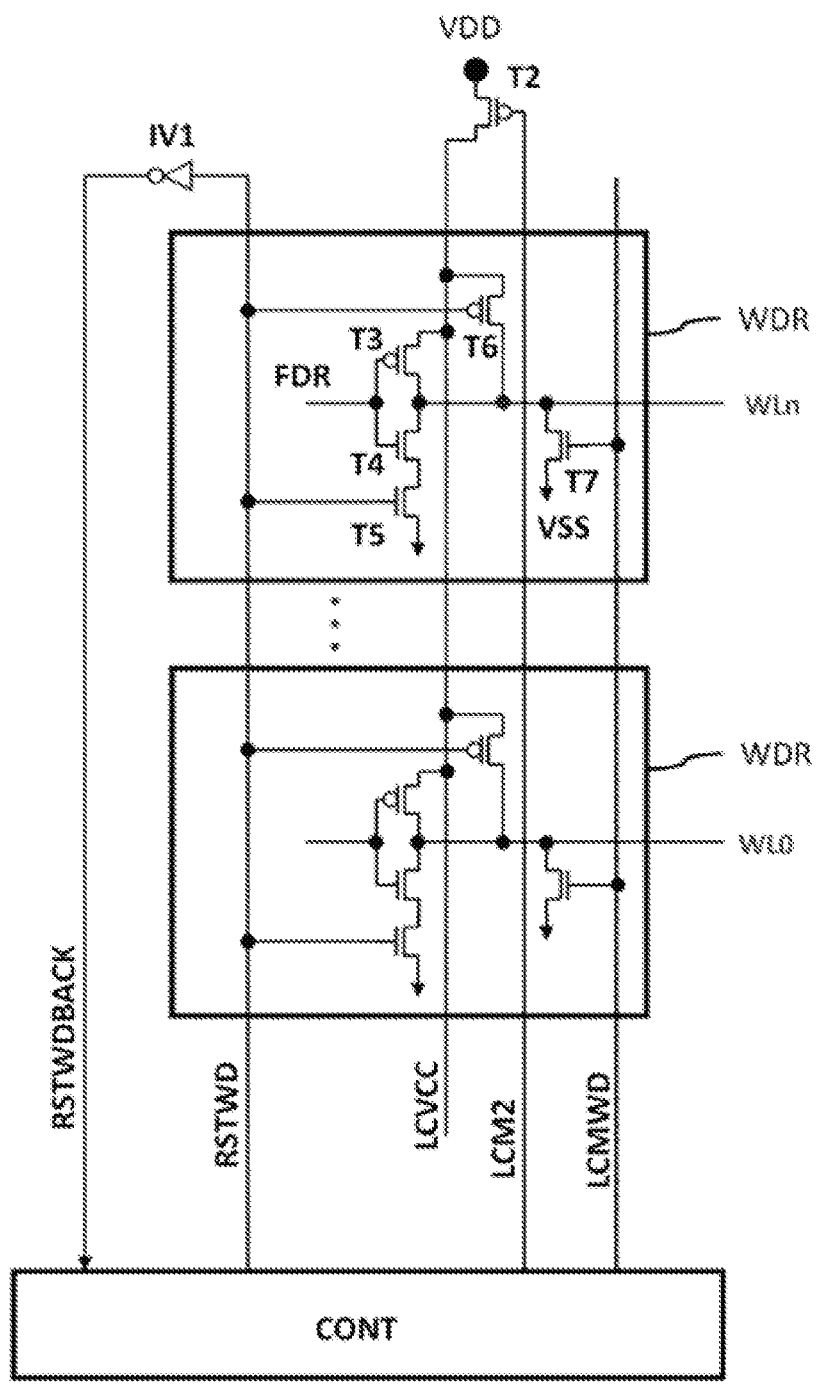
FIG. 4 is a diagram explaining a word driver unit of the memory device in FIG. 1.
Figure 5:
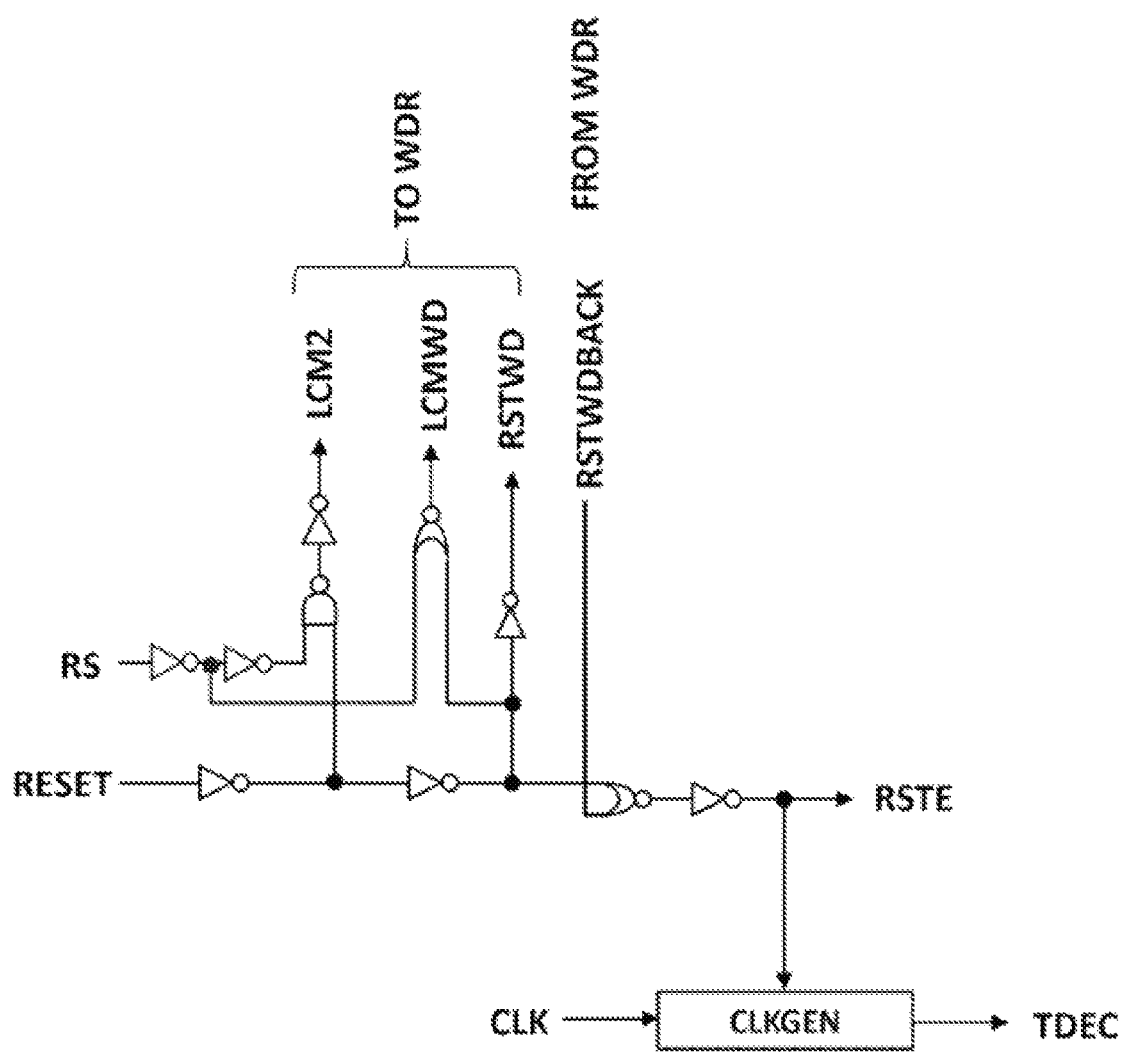
FIG. 5 is a diagram explaining a control unit of the memory device in FIG. 1.
Figure 6:
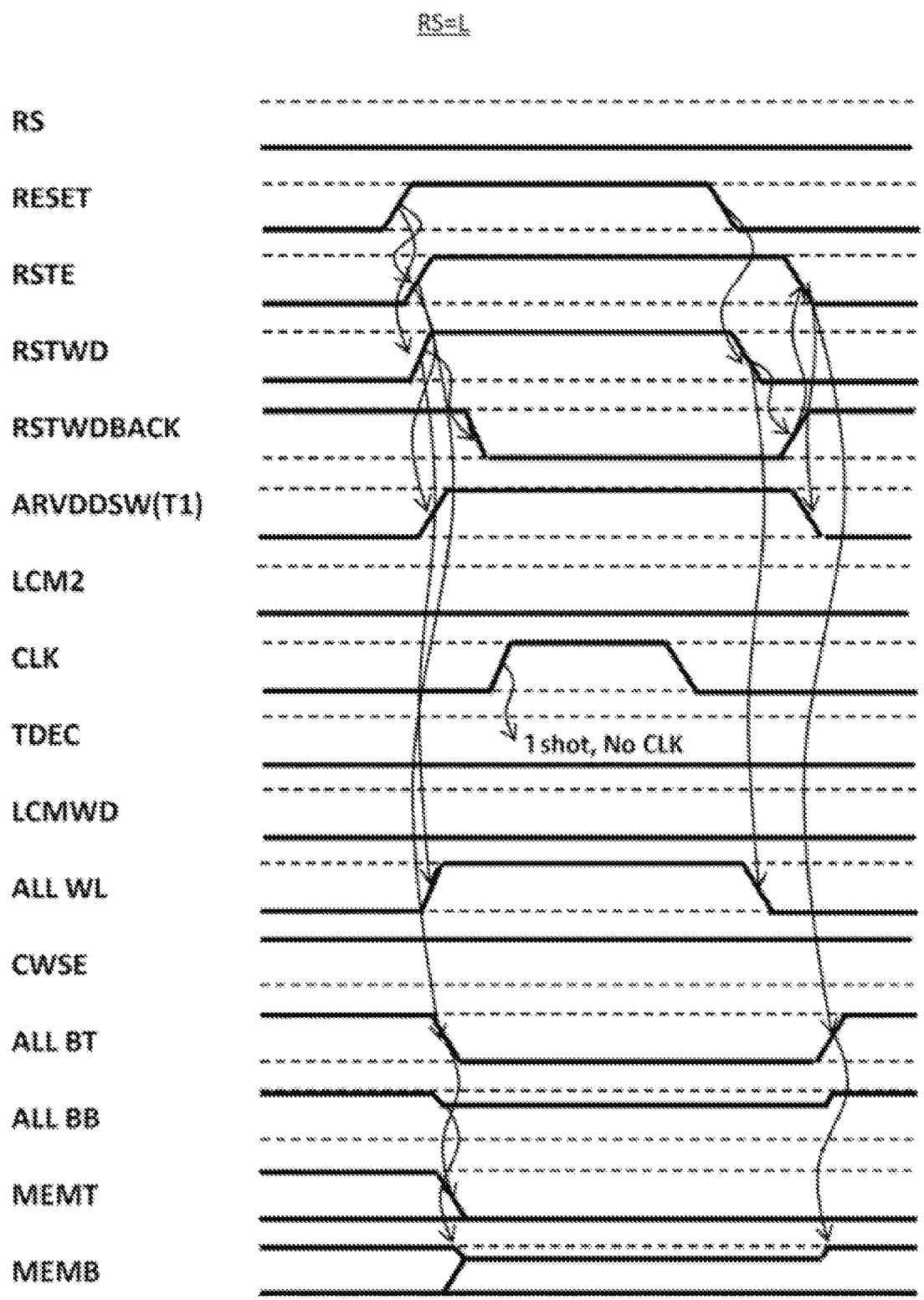
FIG. 6 is a timing chart when a reset signal turns to an ON state at a time of a normal operation state.
Figure 7:
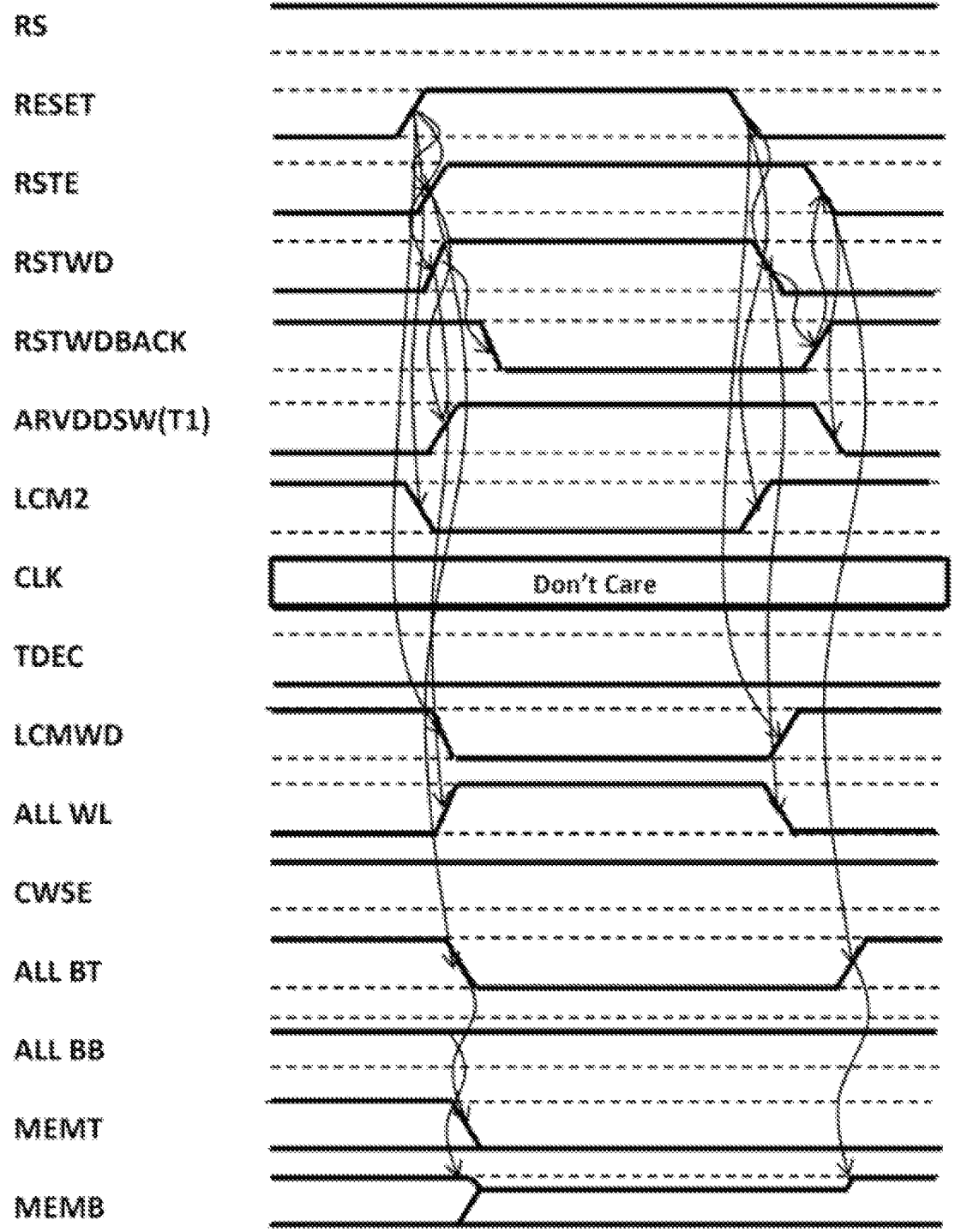
FIG. 7 is a timing chart when the reset signal turns to the ON state at a time of a standby state.

Hereinafter, the present disclosure will be described with reference to the drawings. FIG. 1 is a diagram explaining an entire configuration of a memory device according to a first embodiment. FIG. 2 is a diagram explaining a memory cell unit of the memory device in FIG. 1. FIG. 3 is a diagram explaining an input/output unit of the memory device in FIG. 1. FIG. 4 is a diagram explaining a word driver unit of the memory device in FIG. 1. FIG. 5 is a diagram explaining a control unit of the memory device in FIG. 1. FIG. 6 is a timing chart when a reset signal turns to an ON state at a time of a normal operation state. FIG. 7 is a timing chart when the reset signal turns to the ON state at a time of a standby state.

FIG. 1 shows an entire configuration of a static random access memory (hereinafter, referred to as an "SRAM") 1 that is a memory device. The SRAM 1 is a data holding memory device built in a semiconductor device of a data processing apparatus or the like. In a semiconductor chip in which the data processing apparatus is formed, a central processing unit CPU, the SRAM 1, other peripheral apparatuses and the like are built in.

The SRAM 1 includes a memory array AR, a word line decoder unit (also referred to as a "row decoder unit") RDE, an input/output unit IO, a control unit (also referred to as a "control circuit") CONT, a bit line decoder unit (also referred to as a "column decoder") CDE, and the like.

Memory Array AR

The memory array AR includes: a plurality of memory cells MC arranged in a matrix; a plurality of word lines; and plural pairs of first bit lines BT and second bit lines BB. Each of the memory cells is connected to a pair of the first bit line BT and the second bit line BB, and to one word line WL (denoted by WL0 in FIG. 1). Each memory cell includes: two transfer transistors N3 and N4 composed of N-channel-type MOS field effect transistors; two load transistors P1 and P2 composed of P-channel-type MOS field effect transistors; and two drive transistors N1 and N2 composed of N-channel-type MOS field effect transistors. A source-drain path of the load transistor P1 and a source-drain path of the drive transistor N1 are connected in series to each other between a memory array power supply potential ARVDD and a ground potential VSS. A source-drain path of the load transistor P2 and a source-drain path of the drive transistor N2 are connected in series to each other between the memory array power supply potential ARVDD and the ground potential VSS.

A gate of the load transistor P1 and a gate of the drive transistor N1 are connected to each other to constitute a common gate, a drain of the load transistor P2 and a drain of the drive transistor N2 are connected to each other to constitute a common drain, and the common gate of the load transistor P1 and the drive transistor N1 is connected to the common drain of the load transistor P2 and the drive transistor N2. Likewise, a gate of the load transistor P2 and a gate of the drive transistor N2 are connected to each other to constitute a common gate, a drain of the load transistor P1 and a drain of the drive transistor N1 are connected to each other to constitute a common drain, and the common gate of the load transistor P2 and the drive transistor N2 is connected to the common drain of the load transistor P1 and the drive transistor N1.

A source-drain path of the transfer transistor N3 is connected between the first bit line BT and the common drain of the load transistor P1 and the drive transistor N1. A gate of the transfer transistor N3 is connected to the word line WL0. A source-drain path of the transfer transistor N4 is connected between the second bit line BB and the common drain of the load transistor P2 and the drive transistor N2. A gate of the transfer transistor N4 is connected to the word line WL.

When the word line WL is turned to a selection level such as a high level in a state in which the first bit line BT has write data of a high level "1" and the second bit line BB has write data of a low level "0", the transfer transistors N3 and N4 are turned to an ON state, and data of the high level "1" is stored in the memory cell MC. Meanwhile, when the word line WL is turned to the selection level such as a high level in a state in which the first bit line BT has write data of the low level "0" and the second bit line BB has write data of the high level "1", the transfer transistors N3 and N4 are turned to the ON state, and data of the low level "0" is stored in the memory cell MC. In the present specification, such a state in which the memory cell MC stores the data of the low level "0" will be called a low level data write state, or an initialization state of the memory cell MC. Note that, naturally, such a state in which the memory cell MC stores the data of the high level "1" may be defined as the initialization state of the memory cell MC.

As shown in FIGS. 1 and 2, a source-drain path of a transistor (first transistor) T1 composed of a P-channel-type MOS field effect transistor is connected between the power supply potential VDD and the memory array power supply potential ARVDD, and a control signal RSTE that is turned to the high level "H" at a time of reset is supplied from the control unit CONT to a gate of the transistor T1. As shown in FIG. 2, in the plurality of memory cells MC which constitute one column connected between the first bit line BT and the second bit line BB, respective sources of the load transistors P1 and P2 of the respective memory cells MC are connected to the power supply potential VDD via the source-drain path of the transistor T1. Other columns (not shown) are also constituted in a similar way. Thus, the transistor T1 is turned to an OFF state at the time of reset, and accordingly, memory holding capabilities of all the memory cells MC in the memory array AR are deactivated. Therefore, data stored in the respective memory cells MC can be easily turned to the initialization state. Moreover, it is made possible to turn all the memory cells MC in the memory array AR to the initialization state collectively at one time.

Word Line Decoder RDE

The word line decoder RDE includes: a row decoder circuit (not shown) that decodes an address signal and selects one word line; and a plurality of word line drivers WDR, each of which is connected to the row decoder circuit so as to receive an output therefrom. The plurality of word line drivers WDR are connected to the plurality of word lines WL0-WLn, and drive the selected word lines. As shown in FIGS. 1 and 4, a source-drain path of a transistor (second transistor) T2 composed of a P-channel-type MOS field effect transistor is connected between the power supply potential VDD and a VDD-side terminal of a final driver of the plurality of word line drivers WDR, and a control signal LCM2 that is turned to the low level "L" at the time of reset is supplied from the control unit CONT to a gate of the transistor T2. At the time of reset, the plurality of word line drivers WDR turn all the word lines WL0-WLn to a selection state. The transistor T2 is provided in order to reduce a rush current generated when all the word lines WL0-WLn are raised simultaneously to be turned to the selection state, and is a current limiting PMOS transistor that plays a role to limit an amount of the rush current.

As shown in FIG. 4, each of the word line drivers WDR includes: a final driver FDR composed of a P-channel-type MOS field effect transistor T3 and an N-channel-type MOS field effect transistor T4; and an N-channel-type MOS field effect transistor T5 in which a source-drain path is connected between a source of the N-channel-type MOS field effect transistor T4 and the ground potential VSS. An input of the final driver FDR is connected to the row decoder circuit so as to receive an output therefrom. The word line driver WDR further includes: a P-channel-type MOS field effect transistor T6 in which a source-drain path is connected between the word line WLn connected to an output of the final driver FDR and a source of the transistor T2; and an N-channel-type MOS field effect transistor T7 in which a source-drain path is connected between the word line WLn and the ground potential VSS. Gates of the transistors T5 and T6 are connected to wiring so as to receive a control signal RSTWD, and a gate of the transistor T7 is connected to the wiring so as to receive the control signal LCMWD. The control signal RSTWD is inverted into a control signal RSTWDBACK by an inverter IV1, and is returned to the control unit CONT. Precharge to the bit lines BT and BB is started after the word lines are dropped, and accordingly, the control signal RSTWD is inverted by the inverter IV1 to generate the control signal RSTWDBACK, and the generated control signal RSTWDBACK is returned to the control unit CONT. In the control unit CONT, a logic between the control signal RSTWDBACK and the control signal RSTWD is taken. Specifically, at a time of releasing the reset (that is, when a reset signal shifts from the high level to the low level), a signal on a distal end portion of a word line dropping signal is fed back to the control unit CONT, and after dropping of the word lines is entirely ended, the precharge to the bit lines BT and BB is started. Thus, extra penetrating electric power due to an overlap between an active period while the word lines WL are at the high level and a precharge period of the bit lines BT and BB can be prevented, and accordingly, an operating current at a time of a reset operation can be reduced.

Input/Output Unit IO

As shown in FIG. 1, the input/output unit IO has a precharge circuit including: an equalization transistor EQ composed of a P-channel-type MOS field effect transistor in which a source-drain path is connected between the bit lines BT and BB; a precharge transistor PC1 composed of a P-channel-type MOS field effect transistor in which a source-drain path is connected between the power supply potential VDD and the bit line BT; and a precharge transistor PC2 composed of a P-channel-type MOS field effect transistor in which a source-drain path is connected between the power supply potential VDD and the bit line BB. Respective gates of the transistors EQ, PC1 and PC2 are connected to one another, and are configured to receive a control signal CWSE. The transistors EQ, PC1 and PC2 are turned to the OFF state by such a control signal CWSE of the high level "H", and are turned to the ON state by such a control signal CWSE of the low level "L". At the time of reset, the transistors EQ, PC1 and PC2 are turned to the OFF state by the control signal CWSE of the high level "H". The control signal CWSE can also be referred to as a "column write select signal".

The input/output unit IO further includes: a first write circuit (also referred to as a "write buffer") WBT for supplying write data to the bit line BT; and a second write circuit (also referred to as a "write buffer") WBB for supplying write data to the bit line BB. At the time of reset, the write circuit WBT supplies write data of the low level "L" to the bit line BT, and the write circuit WBB supplies write data of the high level "H" to the bit line BB. Hence, at the time of reset, all the bit lines BT of all the columns are turned to a potential level of the low level "L", and all the bit lines BB of all the columns are turned to a potential level of the high level "H".

The input/output unit IO further includes first and second column switches CTW and CBW for writing. The column switch CTW has a source-drain path connected between an output of the write circuit WBT and the bit line BT. The column switch CBW has a source-drain path connected between an output of the write circuit WBB and the bit line BB. The control signal CWSE is supplied to gates of the column switches CTW and CBW. The input/output unit IO further includes first and second column switches CTR and CBR for reading (see FIG. 3). The column switch CTR has a source-drain path connected between the bit line BT and an input of a sense amplifier SA. The column switch CBR has a source-drain path connected between the bit line BB and the input of the sense amplifier SA. At the time of reset, the column switches CTW and CBW for writing for all the columns are turned to the ON state, and the column switches CTR and CBR for reading for all the columns are turned to the OFF state.

That is, at the time of reset, the transistor T1 is turned to the OFF state, and all the word lines WL are turned to the selection state, and the transfer transistors N3 and N4 of all the memory cells MC are turned to the ON state. Then, the column switches CTW and CBW for writing for all the columns are turned to the ON state, the write circuit WBT supplies the write data of the low level "L" to the bit line BT and the write circuit WBB supplies the write data of the high level "H" to the bit line BB. Thus, the data stored in all the memory cells are turned to the initialization state at a high speed.

FIG. 3 shows a detailed circuit configuration of the input/output unit IO. The input/output unit IO includes: a column selector and precharge unit CPP; and a write buffer and sense amplifier unit WSP. As described with reference to FIG. 1, the column selector and precharge unit CPP includes: the transistors EQ, PC1 and PC2 as a precharge circuit; the column switches CTW and CBW for writing; and the column switches CTR and CBR for reading. A control signal CRSE is supplied to gates of the column switches CTR and CBR for reading. The control signal CRSE can also be referred to as a "column read select signal". At the time of reset, such control signals CRSE of all the columns are turned to the high level "H".

The column selector and precharge unit CPP receives a selection signal Y from the bit line decoder unit CDE at a time of normal writing and at a time of normal reading. Based on a normal writing mode and such a selection signal Y of a selection level "H", the control signal CWSE is turned to the high level "H", and the control signal CRSE is turned to the high level "H". Moreover, based on a normal reading mode and the selection signal Y of the selection level "H", the control signal CRSE is turned to the low level "L", and the control signal CWSE is turned to the low level "L".

The write buffer and sense amplifier unit WSP includes: a data input circuit DIN supplied with input data Din to be written into a memory cell selected at the time of normal writing; and the sense amplifier SA that detects data stored in the memory cell selected at the time of normal reading and outputs the detected data as readout data Dout. At the time of normal writing, the data input circuit DIN generates write data DT to the bit line BT and write data DB to the bit line BB based on the input data Din. The data DT and BT will be supplied to the bit lines BT and BB via the column switches CTW and CBW for writing, which are turned to the ON state. Reference symbols DTB and DBB denote inverted signals of the data DT and BT.

As shown in FIG. 3, the write buffer and sense amplifier unit WSP receives control signals RSTE, LCMN and WTE from the control unit CONT. The control signal RSTE is a signal turned to the high level "H" at the time of reset. The control signal WTE is a signal turned to the high level "H" at the time of normal writing. A control signal RSTEB is an inverted signal of the control signal RSTE. A control signal WTEB is an inverted signal of the control signal WTE. A control signal TIEH is a dummy signal for keeping contrast with the control signal RSTEB in a combinational circuit of a NAND circuit and an OR circuit, which are provided on an output side of the data input circuit DIN. At the time of reset, when the control signal RSTE is turned to the high level "H" (when the control signal RSTEB is turned to the low level "L"), the inverted data signal DTB is turned to the high level "H", and the inverted data signal DBB is turned to the low level "L". Thus, at the time of reset, the bit line BT is turned to the low level "L", and the bit line BB is turned to the high level "H", and therefore, the memory cells MC can be turned to the initialization state.

Control Unit CONT

At the time of reset, the control unit CONT shown in FIG. 1 performs a control to drop an internal one-shot clock, to turn off a write operation and a read operation, and to turn off a column selection. Moreover, at a time of being released from a reset state (that is, at a reset releasing time or a reset mode releasing time), the control unit CONT performs a control to start the precharge to the bit lines BT and BB after waiting for the word lines WL to be raised.

FIG. 5 shows a detailed circuit configuration of the control unit CONT. The control unit CONT is configured to receive a standby signal RS, a reset signal RESET, and a clock signal CLK. When the standby signal RS is turned to the high level "H", the SRAM 1 is set to a standby state. When the standby signal RS is turned to the low level "L", the SRAM 1 is set to a normal operation mode. The normal operation mode includes the reading mode and the writing mode.

When the reset signal RESET is turned to the high level "H", the SRAM 1 is set to the reset state. When the SRAM 1 is set to the reset state, all the memory cells MC in the SRAM 1 will be turned to the initialization state.

The control unit CONT is composed of a plurality of logic circuits shown in FIG. 5. The control unit CONT generates control signals LCM2, LCMWD and RSTWD from the standby signal RS and the reset signal RESET, and supplies the generated control signals LCM2, LCMWD and RSTWD to the word line driver WDR. Moreover, the control unit CONT is supplied with the control signal RSTWDBACK from the word line driver WDR. The control unit CONT generates the control signal RSTE based on the reset signal RESET and the control signal RSTWDBACK. The control signal RSTE is used as a control signal for applying potential setting of memory cell data initialization to the bit lines BT and BB, and as a control signal for cutting off a VDD-side power supply of the memory cells (that is, for turning off the transistor T1). The control signal RSTWDBACK is a return signal of the dropping signal at the distal end of each of the word lines, the return signal serving for starting repercharge of the bit lines after the word lines are dropped at the time of releasing the reset. Moreover, the control unit CONT builds therein an internal clock generation circuit CLKGEN for writing and reading, and the internal one-shot clock CLKGEN receives a clock signal CLK, and generates a control signal TDEC such as an internal one-shot clock. The internal clock generation circuit CLKGEN is configured to receive the control signal RSTE, and is configured to stop generation of internal clocks (internal one-shot clocks) for writing and reading operations at the time of reset. The internal clock generation circuit CLKGEN may be translated into an internal clock generating circuit.

Timing Chart

FIG. 6 is a timing chart when the reset signal RESET is turned from the low level "L" to the high level "H" and the SRAM 1 is turned to the reset state at a time of the normal operation state in which the standby signal RS is set to the low level "L". FIG. 7 is a timing chart when the reset signal RESET is turned from the low level "L" to the high level "H" and the SRAM 1 is turned to the reset state in the standby state in which the standby signal RS is set to the high level "H". Between FIG. 6 and FIG. 7, waveforms of the clock signal CLK and the control signals LCM2 and LCMWD are different.

In FIGS. 6 and 7, the control signal RSTE shifts to the high level "H" based on the high level "H" of the reset signal RESET. Based on the shift of the control signal RSTE to the high level "H", the transistor T1 is turned to the OFF state, all the word lines are turned to the selection level "H", all the bit lines BT are turned to the low level, and all the bit lines BB are turned to the high level. Thus, a storage node MEMT of each of the memory cells MC is turned to the low level, a storage node MEMB of each of the memory cells MC is turned to the high level, and all the memory cells MC are turned to the initialization state. The storage node MEMT is a node of the common drain of the transistor P1 and the transistor N1 in the memory cell MC. The storage node MEMB is a node of the common drain of the transistor P2 and the transistor N2 in the memory cell MC.

In FIGS. 6 and 7, when the reset signal RESET is turned from the high level "H" to the low level "L", such precharge levels are established that the transistor T1 is in the ON state, that all the word lines are at a non-selection level "L", and that all the bit lines BT and all the bit lines BB are at the high level. Note that the memory cells MC remain in the initialization state.

According to the first embodiment, at least one of the following effects can be obtained.

1) The VDD side of the memory array AR is connected to the VDD via the transistor T1. A circuit configuration in which this transistor T1 is turned to the OFF state at the time of reset is adopted. The OFF state of the transistor T1 deactivates the memory holding capabilities of all the memory cells, and can initialize all the memory cells at one time. Thus, an initialization time of all the memory cells can be shortened without the area increase.

2) A circuit configuration in which all the word lines are selected (raised) simultaneously at the time of reset is adopted. The word lines are raised simultaneously, whereby the initialization of the memory cells can be performed simultaneously at one time, and therefore, the initialization time of all the memory cells can be shortened.

3) A circuit configuration is adopted, in which, at the time of reset, the low and high levels for the initialization are applied to all the bit lines BT and BB using the normal data write circuits (WBT, WBB) in the SRAM. Since the data write circuits (WBT, WBB) for the normal memory cells are diverted, no area increase occurs.

4) A circuit configuration in which one shot clock of the internal clock generating circuit CLKGEN for Write/Read is turned to the OFF state by the reset signal is adopted. The internal clock generating circuit CLKGEN is turned to the OFF state. Accordingly, at whichever timing the reset signal RESET may be shifted to the high level, the operation can be instantaneously shifted to the initialization operation of all the memory cells. Therefore, all the memory cells can be turned to the initialization state in a short time irrespective of the operation of the SRAM.

5) A circuit configuration is adopted, in which the source of the PMOS (T3) of the word line raising inverter (final driver FDR) is connected to the power supply potential VDD via the current limiting PMOS (T2). The rush current caused by the fact that all the word lines are raised simultaneously is limited and suppressed by the current limiting PMOS (T2), and accordingly, peak currents of the word line drivers WDR at the time of reset can be reduced.

6) A circuit configuration is adopted, in which, at the time of releasing the reset mode, generated is such timing of starting the precharge to the bit lines BT and BB by the transistors EQ, PC1 and PC2 after dropping the word lines in advance. The extra penetrating electric power due to the overlap between the active period while the word lines WL are at the high level and the precharge period of the bit lines BT and BB can be prevented, and accordingly, the operating current at the time of the reset operation can be reduced.

Second Embodiment

Next, a second embodiment will be described with reference to the drawings. In order to facilitate the understanding, first, considerations of the inventors of the present disclosure will be described with reference to FIGS. 8 to 11.

Figure 8:
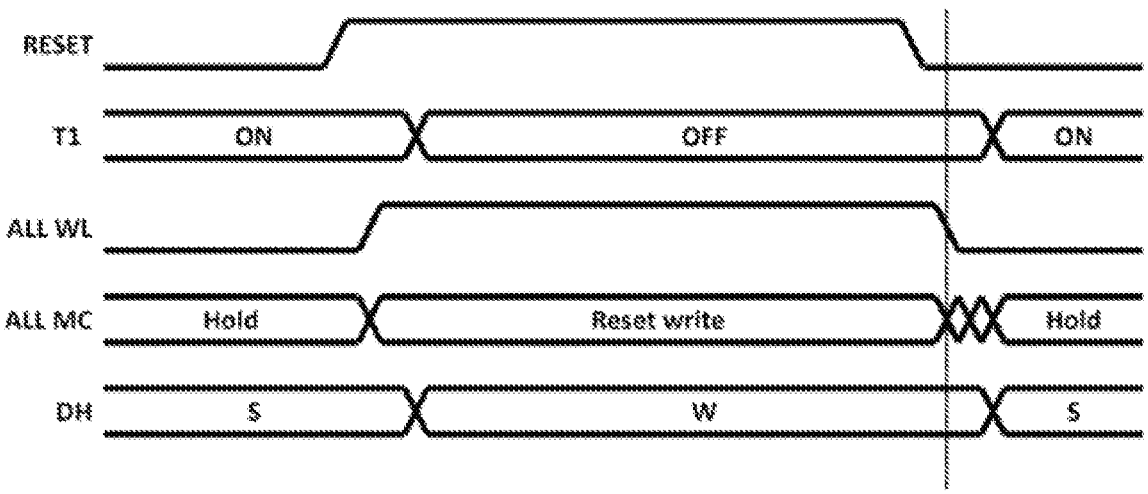
FIG. 8 is a diagram explaining timing in the first embodiment.
Figure 9:
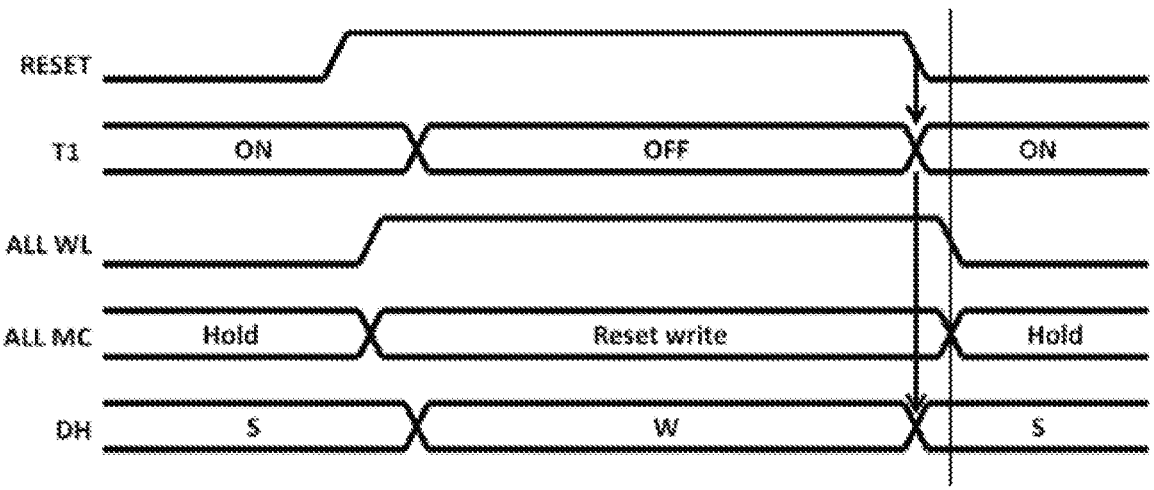
FIG. 9 is a diagram explaining timing in a second embodiment.
Figure 10:
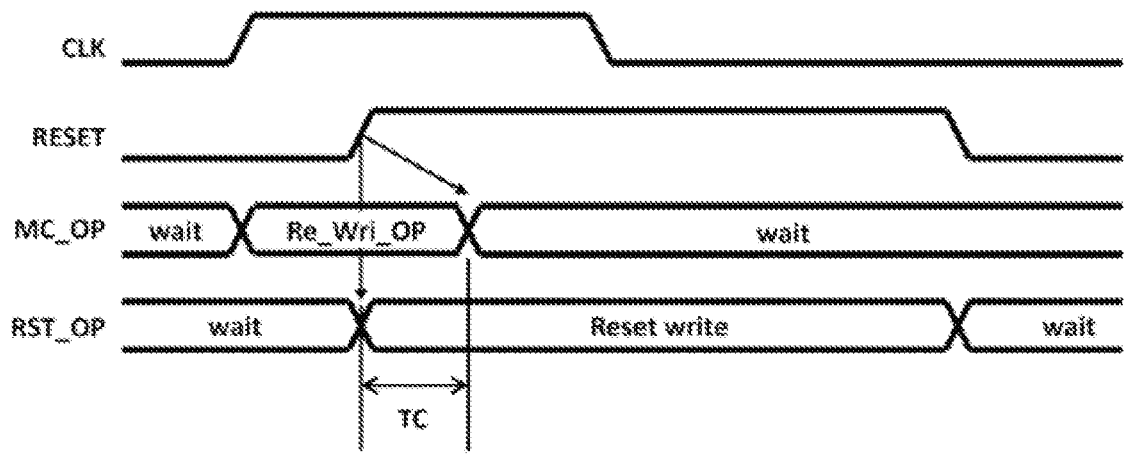
FIG. 10 is a diagram explaining timing when a reset request is generated during a read/write operation in the first embodiment.
Figure 11:
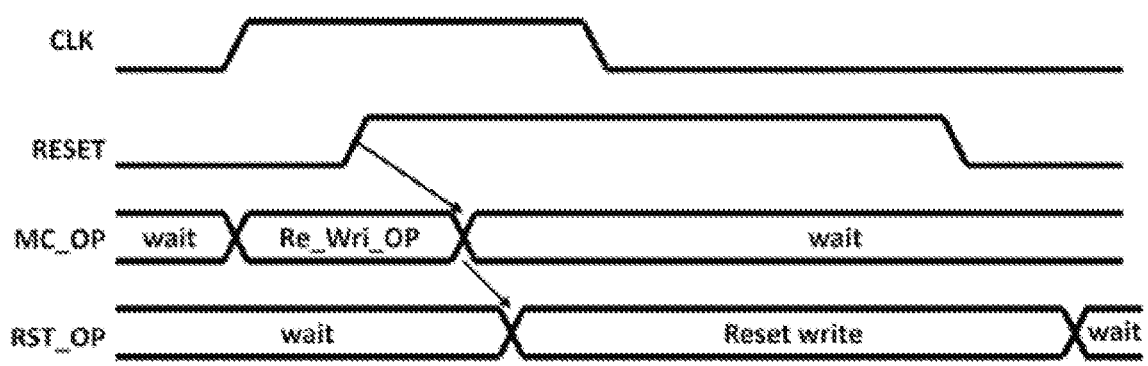
FIG. 11 is a diagram explaining timing when a reset request is generated during a read/write operation in the second embodiment.

FIG. 8 is a diagram explaining timing in the first embodiment. FIG. 9 is a diagram explaining timing in the second embodiment. FIG. 10 is a diagram explaining timing when a reset request is generated during a read/write operation in the first embodiment. FIG. 11 is a diagram explaining timing when a reset request is generated a during read/write operation in the second embodiment. The reset may be translated into a reset mode.

In FIG. 8, in the first embodiment, at the time of releasing the reset (that is, when the reset signal RESET shifts from the high level "H" to the low level "L"), the word lines WL shift from the high level "H" to the low level "L" in a state in which the supply of the power supply potential VDD to the memory cells MC is in the OFF state (that is, in a state in which the power supply potential VDD is not supplied due to the OFF state of the transistor T1). Therefore, the transfer transistors N3 and N4 of each of the memory cells MC are closed, and accordingly, a data holding capability DH on the high level "H" side (storage node MEMB side) of the memory cell MC may become insufficient (weak: W). Accordingly, data written into the memory cell MC during the reset operation may not be held in the memory cell MC. Alternatively, the data written into the memory cell MC during the reset operation may be destroyed. Note that, in FIG. 8, in the data holding capability DH, reference symbol S denotes a state in which the data holding capability on the storage node MEMB side is sufficient.

In FIG. 9, in order to reduce such a possibility that the data written during the reset operation may not be held in the memory cell MC, the possibility having been described with reference to FIG. 8, timing is changed so that, at the time of releasing the reset (that is, when the reset signal RESET shifts from the high level "H" to the low level "L"), the word lines WL shift from the high level "H" to the low level "L" in a state in which the supply of the power supply potential VDD to the memory cells MC is in the ON state (that is, in a state in which the power supply potential VDD is not supplied due to the ON state of the transistor T1). Thus, the data holding capability DH on the high level "H" side (storage node MEMB side) of the memory cell MC turns to a sufficient state (S), and the data written into the memory cell MC during the reset operation can be surely held in the memory cell MC.

Hence, the control unit CONT is configured so that, at the time of releasing the reset mode (that is, after the reset signal RESET shifts from the high level "H" to the low level "L"), generated is such timing that the transistor T1 on the VDD side of the memory array AR is turned to the ON state, then the word lines WL are dropped to the low level "L", and thereafter the transistors EQ, PC1 and PC2 are turned to the ON state to start the precharge to the bit lines BT and BB. The control unit CONT capable of generating such timing will be described below with reference to the drawings.

FIG. 10 shows timing when the reset request is generated during a read operation or a write operation in the normal reading mode or the normal writing mode in the first embodiment. In FIG. 10, a memory operation MC_OP is shown as one including waiting (wait) and the read operation or the write operation (Re_Wri_OP). A reset operation RST_OP is shown as one including waiting (wait) and reset writing (Resetwrite).

As shown in FIG. 10, when the reset signal RESET shifts from the low level "L" to the high level "H" to generate the reset request during the read operation or the write operation Re_Wri_OP, then based on the shift of the reset signal RESET to the high level "H", the memory operation MC_OP shifts from the read/write operation Re_Wri_OP to the waiting wait state to end the read/write operation Re_Wri_OP, and moreover, the reset operation RST-OP shifts from the waiting wait state to the reset writing Resetwrite to start the reset writing Resetwrite.

However, though the normal read/write operation Re_Wri_OP is stopped by the shift of the reset signal RESET to the high level "H", a certain period of time TC is required until the stop of the normal read/write operation Re_Wri_OP. During this certain period of time TC, the read/write operation Re_Wri_OP remains (continues), and accordingly, the read/write operation Re_Wri_OP and the reset writing Resetwrite may conflict with each other. An occurrence of the confliction between the read/write operation Re_Wri_OP and the reset writing Resetwrite leads to an occurrence of a through current path, and this may result in a risk of a flow of a large current.

FIG. 11 shows the timing when the reset request is generated during the read/write operation in the second embodiment. As in FIG. 10, the memory operation MC_OP is shown as one including the waiting (wait) and the read operation or the write operation (Re_Wri_OP). The reset operation RST_OP is shown as one including the waiting (wait) and the reset writing (Resetwrite).

As shown in FIG. 11, when the reset signal RESET shifts from the low level "L" to the high level "H" to generate the reset request during the read/write operation Re_Wri_OP, then based on the shift of the reset signal RESET to the high level "H", the memory operation MC_OP first shifts from the read/write operation Re_Wri_OP to the waiting wait state to end the read/write operation Re_Wri_OP. Next, after the read/write operation Re_Wri_OP is ended, the reset operation RST_OP shifts from the waiting wait state to the reset writing Resetwrite, and the reset writing Resetwrite is started.

As described above, there is no period while the read/write operation Re_Wri_OP and the reset writing Resetwrite overlap each other in time, and accordingly, the occurrence of the through current path can be prevented. Thus, the risk of a flow of a large current can be eliminated. The control unit CONT capable of generating such timing will be described below with reference to the drawings.

Figure 12:
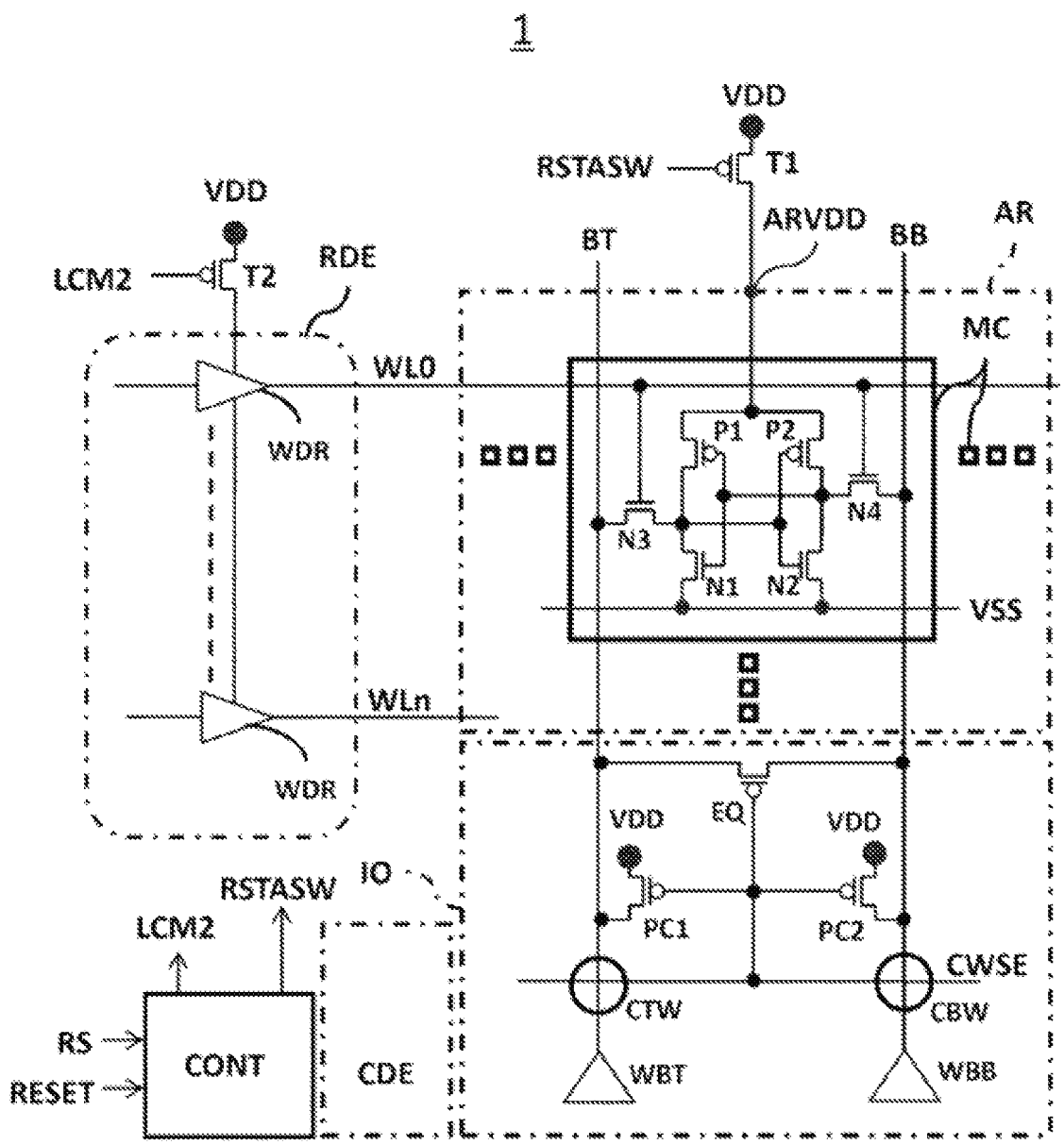
FIG. 12 is a diagram explaining an entire configuration of a memory device according to the second embodiment.
Figure 13:
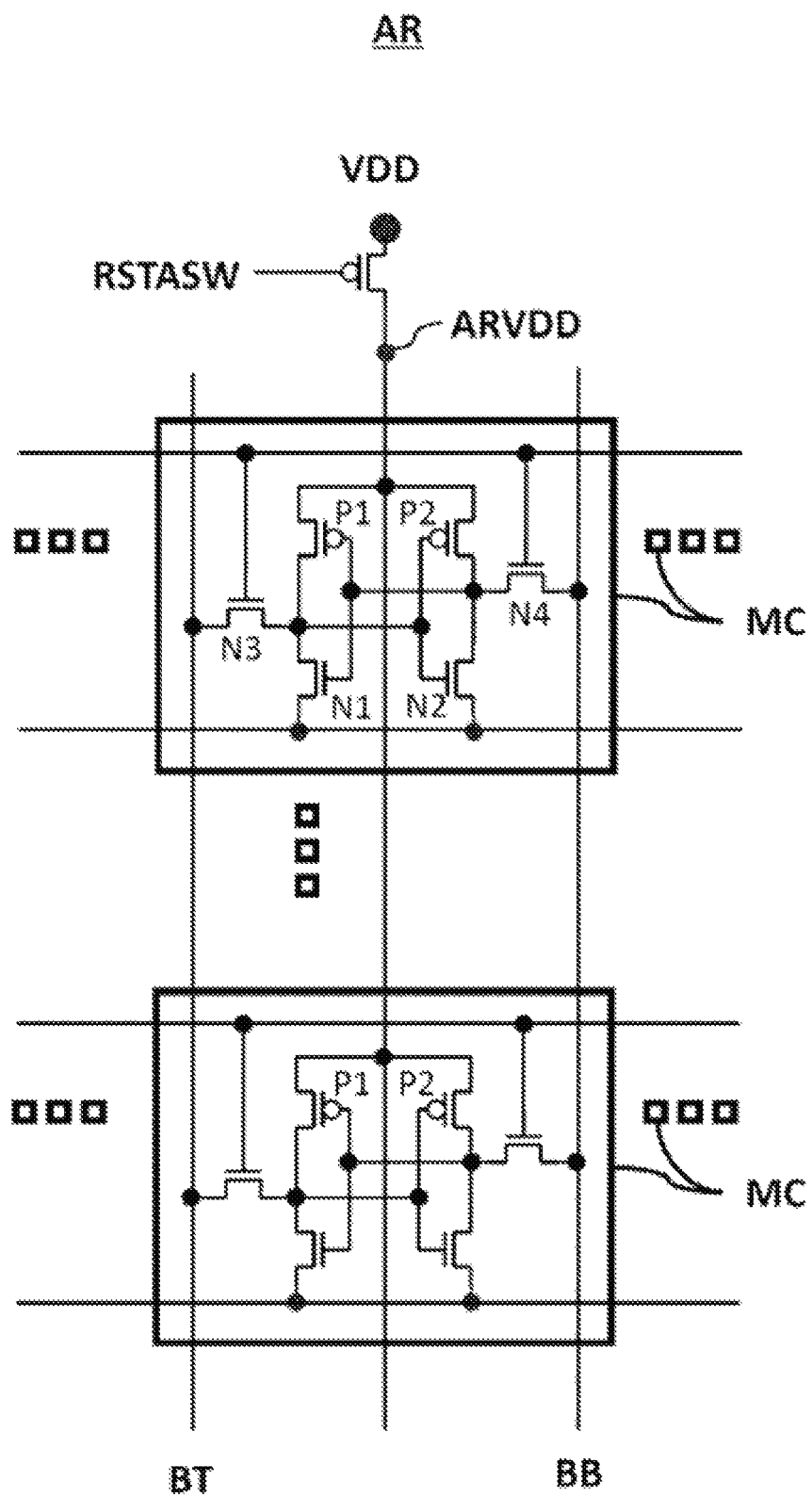
FIG. 13 is a diagram explaining a memory cell unit of the memory device in FIG. 12.
Figure 14:
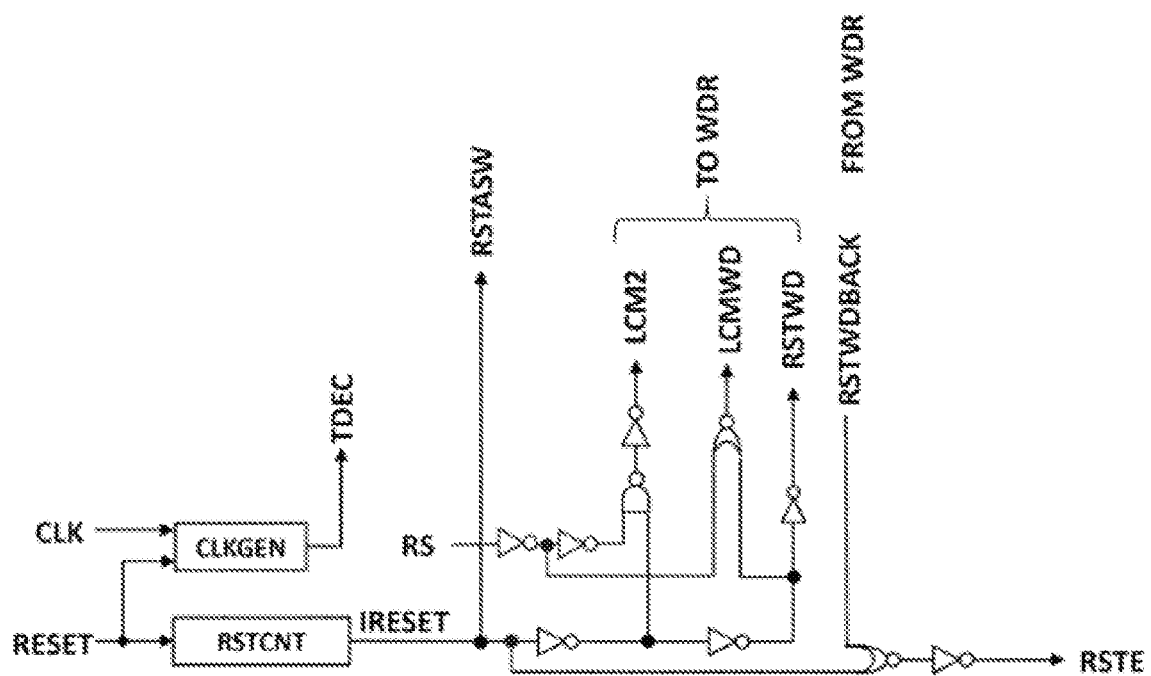
FIG. 14 is a diagram explaining a control unit of the memory device in FIG. 12.
Figure 15:
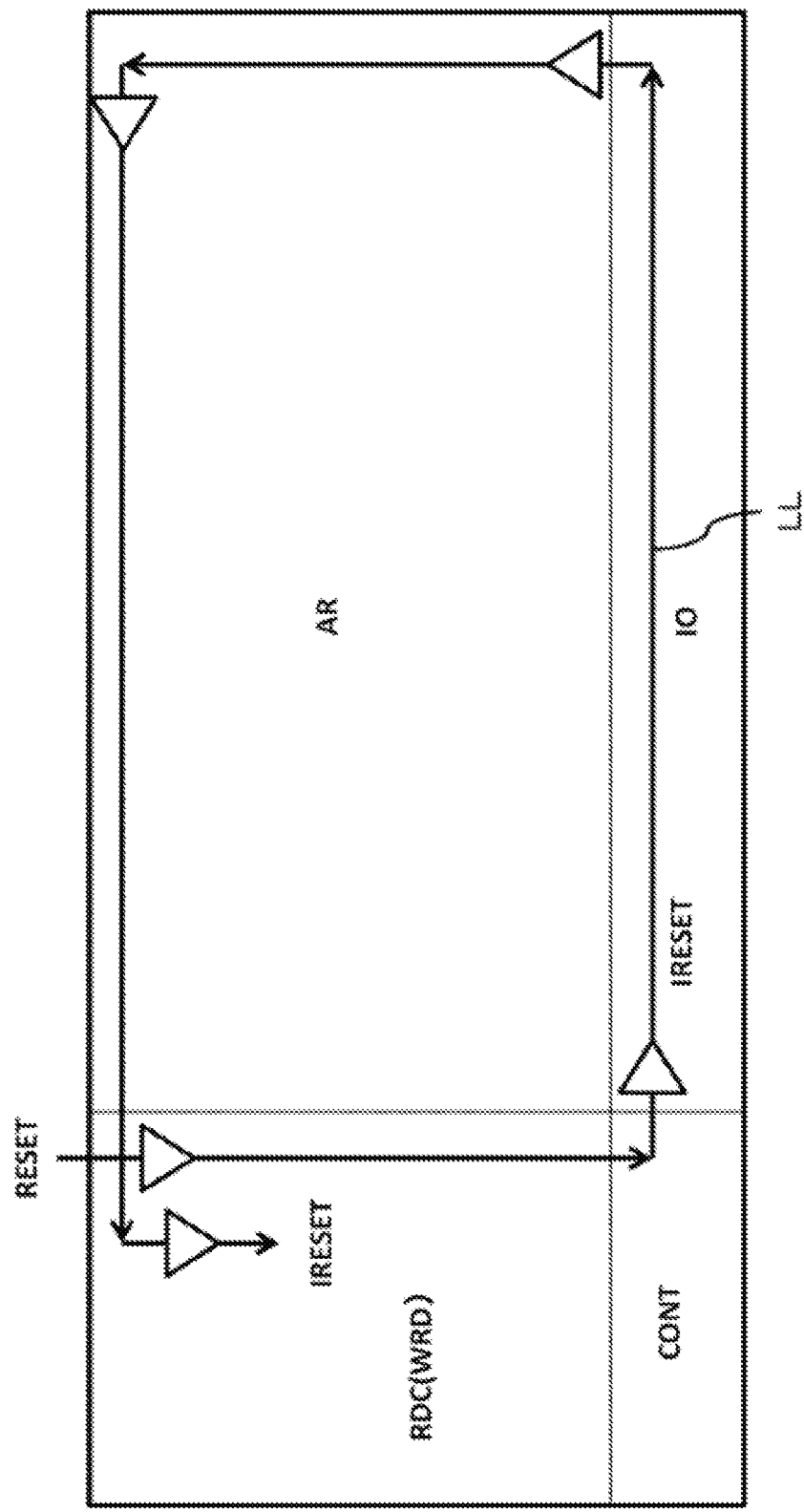
FIG. 15 is a diagram explaining a reset control circuit in FIG. 14.

A memory device of the second embodiment will be described with reference to FIGS. 12 to 15. FIG. 12 is a diagram explaining an entire configuration of the memory device according to the second embodiment. FIG. 13 is a diagram explaining a memory cell unit of the memory device in FIG. 12. FIG. 14 is a diagram explaining a control unit of the memory device in FIG. 12. FIG. 15 is a diagram explaining a reset control circuit in FIG. 14.

FIGS. 12 and 13 are different from FIGS. 1 and 2 in that a control signal RSTASW is supplied to the gate of the transistor T1. Other configurations in FIGS. 12 and 13 are the same as other configurations in FIGS. 1 and 2, and accordingly, a duplicate description will be omitted. The control signal RSTASW is a signal that is generated by the control unit CONT and serves for cutting off the supply of the power supply potential VDD to the memory cells MC. The control signal RSTASW is turned to the high level "H" at the time of reset. At the time of releasing the reset, first, the control signal RSTASW shifts from the high level to the low level so as to turn the transistor T1 to the ON state. Thus, the power supply potential VDD is supplied as the memory array power supply potential ARVDD to the memory cells MC, and accordingly, the low level "L" and the high level "H" in the initialization data written into each of the memory cells MC by the reset writing Resetwrite are surely held in the memory cell MC. Thereafter, all the word lines WL are controlled to shift from the high level "H" to the low level "L". The control unit CONT will be described in detail with reference to FIG. 14.

FIG. 14 shows a detailed circuit configuration of the control unit CONT according to the second embodiment. The control unit CONT in FIG. 14 is different from the control unit CONT in FIG. 5 in the following points.

1) That the internal clock generation circuit CLKGEN receives not the control signal RSTE but the reset signal RESET. The internal clock generation circuit CLKGEN is an internal clock generation circuit for the read operation and the write operation, and is configured to stop internal clocks for the read operation and the write operation at the time of starting the reset or during the reset period.

2) That a reset control circuit RSCNT is provided. The reset control circuit RSCNT is configured to receive the reset signal RESET, and to generate a reset start signal IRESET after the read operation and the write operation are completed. The reset start signal IRESET is supplied as the control signal RSTASW to the gate of the transistor T1.

3) That the control signal RSTE is configured to be generated by a negative OR circuit (NOR) for the reset start signal IRESET and the control signal RSTWDBACK.

As shown in FIG. 15, the reset start signal IRESET is generated by being supplied to a wiring path LL formed so as to go around an outer periphery of the memory array unit AR or an outer periphery of a memory macro. Thus, the timing of the reset start signal IRESET can be configured so that the reset writing of the memory cells MC can be started after the read operation and the write operation are completed when the reset signal RESET is generated at the time of the read operation and the write operation. The memory macro indicates an entire regional portion of the SRAM 1, including the memory array AR, the word line decoder unit (row decoder unit) RDE, the input/output unit IO, the control unit CONT, the bit line decoder unit (column decoder unit) CDE and the like, which are shown in FIGS. 12 and 15.

Next, a description will be given of the operation of the SRAM 1, which shifts in order of Normal Mode 1 (Waiting State)→Entry to Reset State→Release from Reset State→Normal Mode 2 (Waiting State).

(1) Normal Mode 1 (Waiting State):

In this state, the word lines WL are set to the low level "L", the transistor T1 is turned to the ON state by the control signal RSTASW of the low level "L", and the ground potential VSS is set to the low level such as 0 V. Moreover, the control signal CWSE is set to the low level "L", and the first bit line BT and the second bit line BB are precharged to be turned to the precharge level such as the high level. Predetermined data is stored in the memory cells MC.

(2) Entry to Reset State:

(2-1) In the entry to the reset state, the reset signal RESET shifts from the low level "L" to the high level "H". Then, the control signal RSTASW is turned to the high level "H", the control signal CWSE is turned to the high level "H", and the column switches CTW and CBW for writing for all the columns are turned to the ON state. Then, the write circuit WBT supplies the write data of the low level "L" to the bit line BT, and the bit line BT is turned to the low level "L". The write circuit WBB supplies the write data of the high level level "H" to the bit line BB. Herein, the high level of the bit line BB is defined as H-Vtn (Vtn: threshold value of the column switch CBW).

(2-2) Next, all the word lines WL are turned to the high level "H", and the low level "L" of the bit line BT and the high level "H-Vtn" of the bit line BB are written as the initialization data into all the memory cells MC. Thus, the data stored in all the memory cells are turned to the initialization state at a high speed.

(3) Release from Reset State:

(3-1) In the release from the reset state, the reset signal RESET shifts from the high level "H" to the low level "L". Thereafter, the control signal RSTASW is first turned from the high level "H" to the low level "L". All the word lines WL remain at the high level "H", and the control signal CWSE remains at the high level "H". The control signal RSTASW is at the low level "L", whereby the levels of the high-level storage nodes MEMB of all the memory cells MC change from the high level "H-Vtn" to the high level "H".

(3-2) Next, all the word lines WL shift from the high level "H" to the low level "L". The control signal RSTASW is at the low level "L", and the control signal CWSE remains at the high level "H".

(4) Normal Mode 2 (Waiting State):

In the Normal State 2, the control signal CWSE shifts from the high level "H" to the low level "L". The control signal RSTASW remains at the low level "L", and all the word lines WL remain at the low level "L". Thus, the bit line BT and the bit line BB are precharged to the precharge level such as the high level, and the column switches CTW and CBW for writing for all the columns are turned to the OFF state. The initialization data written in the reset state is stored in all the memory cells MC.

As described above, the shift of the operation of the SRAM 1 according to the second embodiment is performed.

According to the second embodiment, at least one of the following effects can be obtained.

(1) Provided is the circuit (CONT) that generates such timing of, at the time of releasing the reset, turning, to the ON state, the switch (first transistor) T1 that supplies the power supply potential VDD to the memory cells MC, then dropping the word lines WL, and finally starting the precharge to the bit lines BT and BB.

(2) By the above-described (1), at the time of releasing the reset, the power supply potential VDD is supplied to the memory cells MC to surely turn the internal data of the memory cells MC to the low level "L" and the high level "H", and all the word lines WL are thereafter shifted from the selection level (high level "H") to the non-selection level (low level "L"), whereby the inversion of the internal data of the memory cells MC can be prevented.

(3) By the above-described (1), extra penetrating electric power can be prevented from being generated due to an overlap between the activity of all the word lines WL and the precharge to the bit lines BT and BB. Thus, the operating current at the time of the reset operation can be reduced.

(4) Provided is the circuit that, when the reset signal is generated during the read/write operation, the reset (reset writing) of the memory cells MC is performed after the read/write operation is completed.

(5) By the above-described (4), the signal (TDEC) of stopping the read/write operation and the signal (IRESET) of starting the reset of the memory cells are provided, whereby the reset operation can be performed without being hindered by the read/write operation.

(6) The circuit (control circuit CONT) that generates the reset start signal (IRESET) of the memory cells MC causes the wiring path of the reset start signal (IRESET) to go around the outer periphery of the memory array AR of the SRAM 1 or the outer periphery of the macro cell of the SRAM 1, thereby generating the timing of the reset start signal (IRESET). Specifically, the control circuit CONT generates the reset start signal (IRESET) by the wiring path caused to go around the outer periphery of the memory array AR or the outer periphery of the memory macro. When the reset signal is generated during the read/write operation, the timing of the reset start signal (IRESET) can be generated according to a layout direction and number of the word lines WL in the memory array AR and a layout direction and number of the bit lines BT and BB, and therefore, a starting time of the reset writing of the memory array AR can be optimized. Thus, the initialization time of the memory cells MC can be shortened.

While the disclosure made by the inventor of the present disclosure has been specifically described on the basis of the embodiments thereof, needless to say, the present disclosure is not limited to the above-described embodiment, and is modifiable in various ways.

What is claimed is:

1. A semiconductor device comprising:
a plurality of word lines;
plural pairs of first bit lines and second bit lines;
a plurality of memory cells connected to the plurality of word lines and the plural pairs of first bit lines and second bit lines so that each of the memory cells is connected to one word line and a pair of the first bit line and the second bit line;
a first transistor provided between the plurality of memory cells and a power supply potential;
a plurality of word line drivers connected to the plurality of word lines;
column switches for writing, the column switches being connected to the plural pairs of first bit lines and second bit lines;
column switches for reading, the column switches being connected to the plural pairs of first bit lines and second bit lines;
a precharge circuit connected to the plural pairs of first bit lines and second bit lines;
write circuits connected to the column switches for writing; and
a control circuit that receives a reset signal,
wherein, based on the reset signal being turned to a high level, the control circuit turns the first transistor to an OFF state, simultaneously sets the plurality of word lines to a selection state, turns the precharge circuit to the OFF state, turns the column switches for writing to an ON state, and turns the column switches for reading to the OFF state, causes the write circuits to turn the first bit lines and the second bit lines to a low level and a high level, respectively, and simultaneously initializes the plurality of memory cells.

2. The semiconductor device according to claim 1, further comprising a current limiting second transistor provided between the plurality of word line drivers and the power supply potential,
wherein the control circuit turns the current limiting second transistor to the ON state based on the reset signal being turned to the high level.

3. The semiconductor device according to claim 1, wherein, when the reset signal shifts from the high level to the low level, the control circuit controls the precharge circuit to start precharge to the plural pairs of first bit lines and second bit lines after all the plurality of word lines turn to a non-selection level.

4. The semiconductor device according to claim 1, wherein the control circuit includes an internal clock generating circuit for writing and reading, and the control circuit stops the internal clock generating circuit when the reset signal is turned to the high level.

5. The semiconductor device according to claim 1, wherein, when the reset signal shifts from the high level to the low level, the control circuit controls the first transistor to turn to the ON state and to supply the power supply potential to the plurality of memory cells, thereafter controls all the plurality of word lines to turn to a non-selection level, and thereafter controls the precharge circuit to start precharge to the plural pairs of first bit lines and second bit lines.

6. The semiconductor device according to claim 1, wherein a write operation or a read operation for the plurality of memory cells are provided, and when the reset signal shifts from the low level to the high level during the write operation or the read operation, the control circuit starts to initialize the plurality of memory cells after the write operation or the read operation is completed.

7. The semiconductor device according to claim 6, further comprising:
   a memory array including the plurality of memory cells, the plurality of word lines and the plural pairs of first bit lines and second bit lines; and
   a memory macro including the memory array, the plurality of word line drivers, the column switches for writing, the column switches for reading, the precharge circuit, the write circuit, and the control circuit,
   wherein the control circuit generates a reset start signal for the plurality of memory cells by a wiring path caused to go around an outer periphery of the memory array or an outer periphery of the memory macro.

* * * * *